United States Patent [19]

Rountree

[11] Patent Number: 5,394,370
[45] Date of Patent: Feb. 28, 1995

US005394370A

[54] HIGH SPEED PARALLEL TEST ARCHITECTURE

[75] Inventor: Robert N. Rountree, Plano, Tex.

[73] Assignee: Texas Instruments Incorporated, Dallas, Tex.

[21] Appl. No.: 180,634

[22] Filed: Jan. 13, 1994

Related U.S. Application Data

[62] Division of Ser. No. 673,905, Mar. 22, 1991, Pat. No. 5,305,266.

[51] Int. Cl.⁶ .................................. G11C 7/00
[52] U.S. Cl. ...................... 365/201; 365/220; 365/189.07
[58] Field of Search ............ 365/189.04, 189.07, 365/201, 207, 220

[56] References Cited

U.S. PATENT DOCUMENTS

| | | | |
|---|---|---|---|
| 4,891,792 | 1/1990 | Hanamura et al. | 365/207 X |
| 4,914,630 | 4/1990 | Fujishima et al. | 365/189.04 |
| 5,132,937 | 7/1992 | Tuda et al. | 365/201 |
| 5,220,527 | 6/1993 | Ohsawa | 365/149 |
| 5,305,266 | 4/1994 | Rountree | 365/201 |

OTHER PUBLICATIONS

Arimoto et al., "A 60-ns 3.3V-Only 16-Mbit DRAM w/Multipurpose Register", IEEE J. S. S. Ckts. v.24 n.5, Oct. 1989 pp. 1184-1190.

Kitsukawa et al., A 23-ns 1-Mb BiCMOS DRAM, IEEE Journal of Solid-State Circuits, vol. 25, No. 5, Oct. 1990, pp. 1102-1111.

*Primary Examiner*—Steven Mottola
*Attorney, Agent, or Firm*—Mark A. Valetti; Douglas A. Sorensen; Richard L. Donaldson

[57] ABSTRACT

The present invention is a dynamic type semiconductor memory device comprising a plurality of memory cells (not shown), plural pairs of bit lines, a first sense amplifier (20), arranged for each of the plural pairs of bit lines, for amplifying a bit line signal. A pair of data input/output lines extracts data from a pair of bit lines. A second sense amplifier (22), is arranged for each of said plural pairs of bit lines and consists of first and second driver MOS transistors (52 in FIG. 3) gates of which are connected to the pair of bit lines. The second sense amplifier is activated when said first sense amplifier is activated, for amplifying signals of the pair of data input/output lines. First and second column selecting transistors (30 in FIG. 2) are inserted between the pair of data input/output lines and the second sense amplifier and gates of which are connected to a column selecting line. A first write transistor (54 in FIG. 3) is connected between the first bit line and one output terminal of said second sense amplifier, the first write transistor being turned on in a data writing operation. A second write transistor (56 in FIG. 3) is connected between the second bit line and the other output terminal of the second sense amplifier, the second write transistor being turned on in a data writing operation.

10 Claims, 2 Drawing Sheets

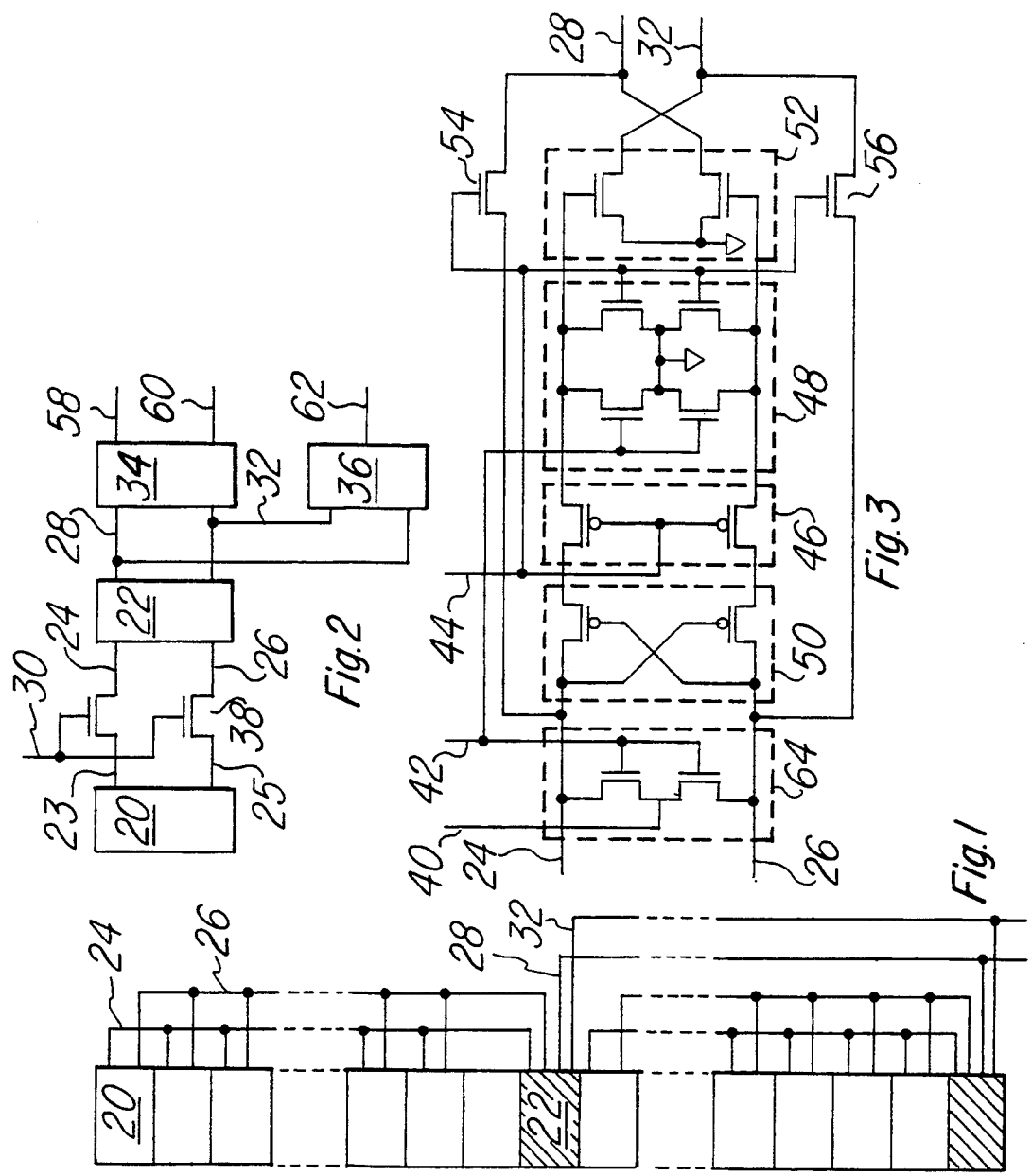

HIGH SPEED PARALLEL TEST ARCHITECTURE

This is a division of application Ser. No. 07/673,905, filed Mar. 22, 1991, now U.S. Pat. No. 5,305,266.

A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

NOTICE (C) Copyright, *M* Texas Instruments Incorporated 1991.

FIELD OF THE INVENTION

The invention pertains to integrated circuit architecture, and more particularly to memory circuit architecture.

BACKGROUND OF THE INVENTION

A major concern for advanced dynamic RAMs (DRAM) has become test time reduction. Previous DRAMs could achieve relatively efficient test time reduction through design for test (DFT) schemes, because the number of parallel bits to be tested was on the same order in size as the maximum word size. For example, the 4MB DRAM is capable of x8 and x16 parallel test, because 16 bits are available from the array on each read cycle. For the 16MB DRAM, x16 and x32 parallel tests are possible, but the x32 requires that an additional array of memory cells and amplifiers be enabled in order to read 32 bits from the array in one cycle. The enabling of an additional array of memory cells and their corresponding amplifiers is a problem because the total power required to enable the additional array in conjunction with the enabled arrays for the x16 test exceeds, in most situations, the power required during normal usage (and may even exceed the maximum power limit for the memory device). The problem becomes much more difficult for the 64MB (and greater) DRAM, where x64 parallel test is a minimum requirement and access time and silicon area are critical considerations.

SUMMARY OF THE INVENTION

The present invention is a circuit comprising: a plurality of memory cells; a plurality of first amplifiers (each first amplifier is preferably comprised of; a plurality of sense amplifiers, a block amplifier, and a second means, preferably a block-I/O pair, to connect the plurality of sense amplifiers to the block amplifier), wherein each first amplifier is selectively connected, preferably by a bitline pair, to a portion of the plurality of memory cells; a Second amplifier connected to the plurality of first amplifiers by a first means, preferably a local-I/O pair; and a means of comparing data, preferably determining whether the data are comprised of the same data states on the first means, from the selectively connected portions of the plurality of memory cells with data from the remainder of the selectively connected portions of the plurality of memory cells.

More specifically, a preferred embodiment of the present invention is a circuit comprising: a plurality of memory cells; a plurality of sense amplifiers; a plurality of bitlines, each connecting a portion of the plurality of memory cells to a the sense amplifier; a plurality of the block amplifiers; a plurality of block input/output pairs, each pair connecting a different portion of the plurality of sense amplifiers to a block amplifier; a local amplifier; and a local data line pair connecting the plurality of block amplifiers to the local amplifier.

One advantage of the present embodiment is that it facilitates parallel testing of memory cells. In the preferred embodiment, many memory cells can be tested simultaneously without a significant increase in power consumption or access time (in comparison with the normal read/write operation). The extra components, the block amplifiers and the block I/O pairs, required for the preferred embodiment require little extra area on the chip (in comparison with prior art architectures), because the block amplifiers are situated in previously unoccupied areas of the sense amplifier columns.

BRIEF DESCRIPTION OF THE DRAWINGS

FIG. 1 and 2 are block diagrams illustrating the architecture of the preferred embodiment. FIG. 3 is a circuit level diagram of one component of the preferred embodiment.

DETAILED DESCRIPTION OF PREFERRED EMBODIMENTS

Figure 4:
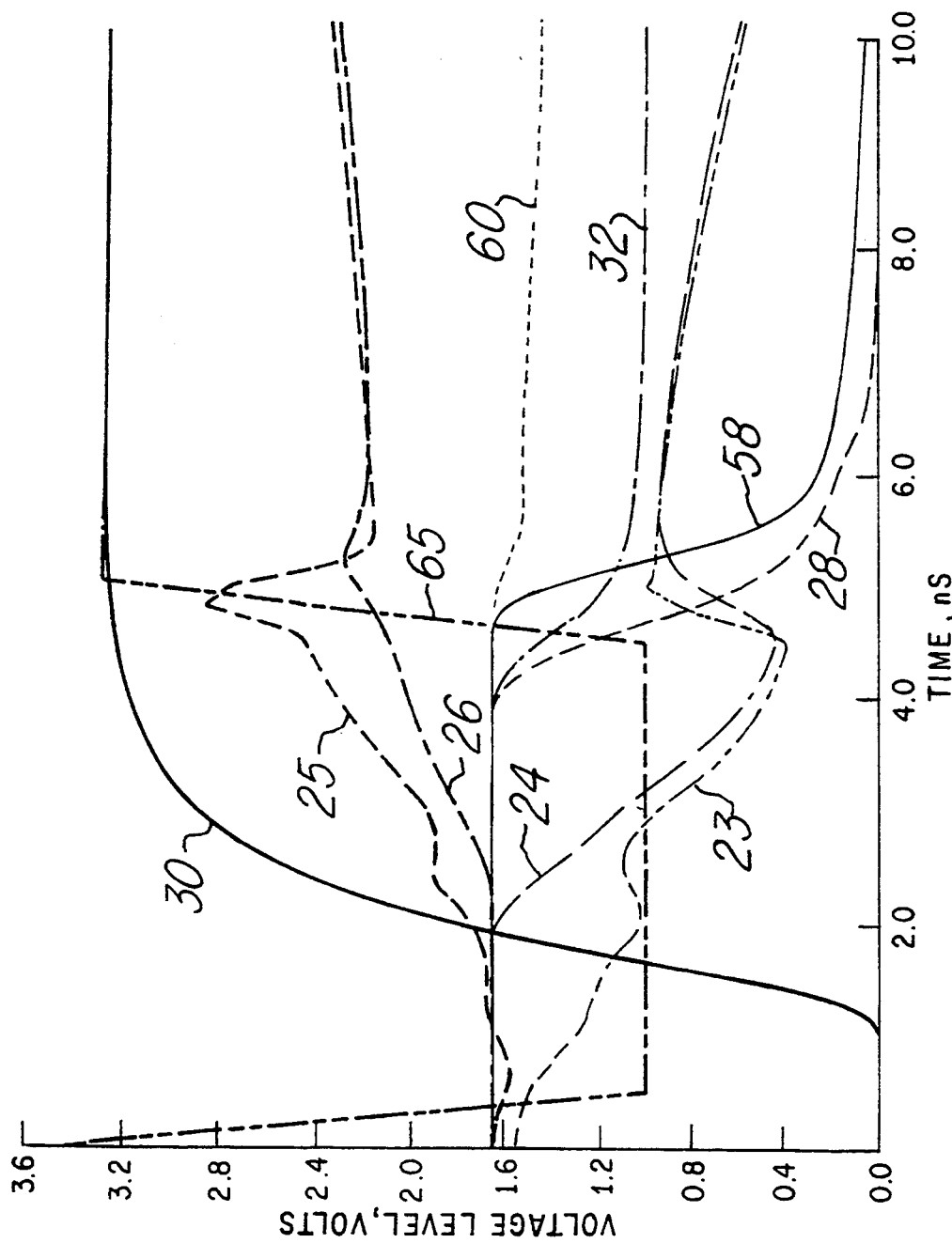
FIG. 4 is a timing diagram illustrating a possible input/output of each block of FIG. 2.

A preferred embodiment of the present invention is illustrated in FIGS. 1 through 4. FIGS. 1 and 2 are block diagram representations of the preferred embodiment, FIG. 3 is a circuit level diagram of a single block amplifier of the preferred embodiment, and FIG. 4 is a timing diagram of the preferred embodiment. Like numerals are used throughout the drawings to represent like and corresponding parts.

FIG. 1 illustrates a single column of sense and block amplifiers with some of their associated input/output (I/O) lines. The I/O lines are shown to the sides of the amplifier circuits for simplicity but are actually not fabricated in this manner. Each column contains a plurality of sense amplifiers 20 (SA), preferably 1024 sense amplifiers per column, and block amplifiers 22 (BA), preferably 16 block amplifiers per column. There are two of these active columns for each array of storage cells, and there are, preferably, multiple storage arrays for a memory device. Two of the I/O's which connect the sense amplifier 20 to the block amplifier 22 are block-I/O 24 (BIO) and block-I/O-bar 26 ($\overline{\text{BIO}}$). Preferably, there is one BIO 24 and one $\overline{\text{BIO}}$ 26 connecting a plurality of sense amplifiers 20 to a corresponding block amplifier 22. The other I/O's which connect the block amplifier 22 to the local amplifier (not shown) are local-I/O 28 (LIO) and local-I/O-bar 32 ($\overline{\text{LIO}}$). Every block amplifier 22 of a column is preferably connected to one LIO pair. There are many block amplifiers 22 for each local amplifier (not shown), preferably 16 block amplifiers for each local amplifier.

FIG. 2 is an illustration of a data path, utilizing a single sense amplifier 20, a single block amplifier 22, a single error detection circuit 36, and a single local amplifier 34 (LA). This data path is used for reading from a cell and writing back to the cell. For simplicity and reduction of redundancy, an explanation of the read function is described without mention to the write function. Preferably, there are 64 sense amplifiers 20 for each block amplifier 22, 16 block amplifiers 22 for each local amplifier 34 and each error detection circuit 36, and 132 local amplifiers 34 shared by eight global amplifiers (not shown). For a read cycle, a bit and its compliment are output from the sense amplifier along the sense-node 23, SN, and sense-node-bar 25, $\overline{SN}$, respectively. If the y-select 30, $Y_s$, is at level of "logic high", then the n-channel FETs 38 will turn on, thus connecting the sense amplifier 20 to the block amplifier 22 via the BIO 24 and $\overline{BIO}$ 26. The output of the block amplifier becomes the input, via the local-I/O 28 (LIO) and the local-I/O-bar 32 ($\overline{LIO}$), to the local amplifier 34 and the error detection circuit 36.

If one sense amplifier 20 per each block amplifier 22 (therefore, for each BIO pair), of a particular column, is accessed, and each sense amplifier is reading from a cell with the same logic value (e.g. "logic high"), then the output on each accessed sense amplifier's SN 23 should be the same (.e.g. "logic high"). This is also true for each accessed sense amplifier's $\overline{SN}$25 (e.g. "logic low"). Likewise, the level on each block amplifier's LIO 28 should be the same (e.g. "logic high"), and the level on each block amplifier's $\overline{LIO}$ 32 should be the same (e.g. "logic low"). In this case (the levels on the LIO 28 and $\overline{LIO}$ 32 are different), the output of the error detection circuit 62, $\overline{ER}$, will remain at a level of "logic high" (meaning no error detected). In the case where one or more of the accessed storage cells has a transposed bit or the bit is transposed when reading it, the output on each accessed BL connected to a storage cell without a transposed bit will have one logic level (e.g. "logic high"), while the output on each accessed BL connected to a storage cell with a transposed bit will have the opposite logic level (e.g. "logic low"). The same is also true for each accessed $\overline{BL}$. The logic value of the output of each block amplifier will be the same as that of the block amplifier's input. The LIO, on the other hand, is connected to a plurality of block amplifiers, some of which have transposed logic levels. Due to the mixtures of logic levels, the difference between the voltage level on the LIO and the $\overline{LIO}$ will be undistinguishable with respect to the error detection circuit. Therefore, the input to the error detection circuit will be two "logic lows", and $\overline{ER}$ will output a "logic low" level (meaning an error detected). The difference in the voltage levels on the LIO and the $\overline{LIO}$ will cause the local amplifier to distinguish (because it utilizes a differential amplifier) the logical value that a majority of the block amplifiers, feeding the LIO and $\overline{LIO}$, had. Therefore, the output of the local amplifier, global-I/O 58 (GIO) and global-I/O-bar 60 ($\overline{GIO}$), will correspond to logical levels read from the majority of the cells, but this output is only significant in the parallel read operation if $\overline{ER}$ remains at a "logic high" level.

FIG. 3 is a circuit level-illustration of a preferred embodiment of a block amplifier. When reading from a cell, the inputs of the block amplifier are BIO 24 and $\overline{BIO}$ 26, and the outputs are LIO 28 and $\overline{LIO}$ 32. The opposite is true for writing to a cell. Two FETs 64 are connected to BIO 24 and the $\overline{BIO}$ 26. The common node for the two FETs is connected to a dc supply, which has a value of half of the supply voltage and is called the bitline reference potential 40 (BLR). The gates of the two FETs are connected to a line carrying a control signal 42 (EQ). The purpose of the FETs is to equalize the BIO 24 and the $\overline{BIO}$ 26 to the BLR level when the EQ signal goes high. BIO 24 and $\overline{BIO}$ 26 are also connected to a differential amplifier 50. The lines on the output (when reading) of the differential amplifier 50 are pre-charged to a zero, or ground, potential. If the signal on the BIO 24 is greater than that on the $\overline{BIO}$ 26, then the p-channel FET on the BIO 24 turns on and the pre-charged value of the output is replaced by the level of the input on BIO 24, and the FET on $\overline{BIO}$ 26 remains cut-off thereby preserving the precharged level on the output. If the signal of the $\overline{BIO}$ 26 is greater than the signal on the BIO 24, then the reverse is true. A p-channel FET is connected in series with each output of the differential amplifier 50. The gates of these two FETs 46 are connected to a control signal 44, write enable (WE). If WE is high then the two FETs will turn off, thus disconnecting BIO 24 to $\overline{LIO}$ 32 and $\overline{BIO}$ 26 to LIO 28 through the read path and allowing signals to flow from the LIO 28 to BIO 24 (and from the $\overline{LIO}$ 32 to $\overline{BIO}$ 26) along the write paths. One write path is connected at BIO 24 through an n-channel FET (whose gate is connected to WE 44) to the LIO 28, the other write path is connected in a similar manner from the $\overline{BIO}$ 26 through an n-channel FET to the $\overline{LIO}$ 32. Two parallel sets of n-channel FETs (whose common nodes are tied to ground) are connected from one output of the write enable FETs 46 to the other. The gates of one set of FETs are connected to EQ 42, and the gates of the other set of FETs are connected to WE 44. The purpose of this block is to disable the read function during either equalization or a write operation. The outputs of the write enable FETs 46 are each connected to the gate of an n-channel FET 52. One of the other terminals of each of the FETs is connected to ground, while the third is connected to LIO 28, in the case where the connection to the gate of the FET was made on the $\overline{BIO}$ 26 portion of the read path, and $\overline{LIO}$ 32, for the case where the connection to the gate of the FET was made on the BIO 24 portion of the read path. If the signal at the gate of the FET is high, then the FET will turn on, thus bringing the output to ground. If the signal at the gate of the FET is low (no greater than the threshold voltage of the FET) then the FET will remain turned off and the output of the FET will remain at its precharged level (which is a "logic high" level). Therefore, if the signal on the BIO portion of the read path is high, the output on the $\overline{LIO}$ 32 line is low, and the signal on the $\overline{BIO}$ portion of the read path must be low making the LIO 28 line high.

FIG. 4 is a timing diagram of the block diagram of FIG. 2 with SN 23 having a "logic low" and $\overline{SN}$ 25 having a "logic high". When the left or right select control signal 65 (designated by a $T_L$ or a $T_R$, respectively) is at a level of "logic high" and the other is at a level of "logic low", the sense amplifier is connected to memory cells in the array to the right or to the left depending on the control signal 65. At a time just prior to 2nS, $Y_s$ 30 goes high and BIO 24 and $\overline{BIO}$ 26 start to follow SN 23 and $\overline{SN}$ 25. At a time just prior to 4nS, the levels on LIO 28 and $\overline{LIO}$ 32 start to change with respect to one another. Both LIO 28 and $\overline{LIO}$ 32 drop beneath the supply voltage, which in this case is 3.3V, divided by two, but the difference between the two lines becomes greater. At a time between 4nS and 5.5nS, the GIO 58 and $\overline{GIO}$ 60 start to deviate with respect to one another, thus achieving an output that is consistent with the input, but having a greater difference between the bit and its compliment.

Although specific embodiments of the present invention are herein described, they are not to be construed as limiting the scope of the invention. Many embodiments of the present invention will become apparent to those skilled in the art in light of methodology and architecture of the specification. The scope of the invention is limited only by the claims appended.

What is claimed is:

1. A memory device comprising:
   a. a plurality of memory cells;
   b. a plurality of bit line pairs, each pair of which consists of first and second bit lines, for extracting data signals from said plurality of memory cells;
   c. a first sense amplifier, coupled to a selected pair of bit lines, for amplifying selected data signals;
   d. a pair of data input/output lines, consisting of first and second data input/output lines, for extracting said selected data signals from said selected pair of bit lines;
   e. a second sense amplifier, comprising first and second driver MOS transistors, each having a gate electrode coupled to one bit line of said selected pair of bit lines, responsive to said selected data signals from said first sense amplifier, for amplifying said selected data signals;
   f. an amplifier, having inputs coupled to receive said selected data signals from said second sense amplifier, for amplifying said selected data signals in a data reading operation;
   g. first and second column selecting transistors, having gate electrodes connected to a column selecting line, for selectively coupling said selected pair of bit lines to said amplifier;
   h. a first write transistor, having a current path coupling said first bit line to one output terminal of said second sense amplifier, said first write transistor being turned on in a data writing operation; and
   i. a second write transistor, having a current path coupling said second bit line to the other output terminal of said second sense amplifier, said second write transistor being turned on in a data writing operation.

2. A memory device as in claim 1 wherein said memory cells are dynamic random access memory cells.

3. A memory device as in claim 1 wherein said first and second column selecting transistors couple said selected pair of bit lines to said second sense amplifier.

4. A memory device as in claim 1 wherein said first and second column selecting transistors couple said second sense amplifier to said amplifier.

5. A memory device as in claim 1 further comprising:
   a. a third sense amplifier, coupled to another selected pair of bit lines, for amplifying other selected data signals;
   b. a second pair of data input/output lines, consisting of third and fourth data input/output lines, for extracting said other selected data signals from said third sense amplifier; and
   c. a fourth sense amplifier, comprising first and second driver MOS transistors, each having a gate electrode coupled to one bit line of said another selected pair of bit lines, responsive to said other selected data signals from said third sense amplifier, for amplifying said other selected data signals at said inputs of said amplifier in a data reading operation.

6. A memory device comprising:
   a. a plurality of memory cells;
   b. a pair of bit lines comprising first and second bit lines, for receiving data signals from said plurality of memory cells;
   c. a first sense amplifier, coupled to said first and second bit lines, for amplifying said data signals;
   d. a pair of data input/output lines, comprising first and second data input/output lines, for extracting said data signals from said first sense amplifier;
   e. a second sense amplifier, comprising first and second driver MOS transistors, each having a gate electrode coupled to one bit line of said pair of bit lines, responsive to said data signals from said first sense amplifier, for amplifying said data signals;
   f. an amplifier, having input terminals coupled to receive said data signals from said second sense amplifier, for amplifying said data in a data reading operation;
   g. first and second column selecting transistors, having gate electrodes connected to a column selecting line, for selectively coupling said first and second bit lines to said amplifier;
   h. a first write transistor, having a current path coupling said first bit line to one output terminal of said second sense amplifier, said first write transistor being turned on in a data writing operation; and
   i. a second write transistor, having a current path coupling said second bit line to the other output terminal of said second sense amplifier, said second write transistor being turned on in a data writing operation.

7. A memory device as in claim 6 wherein said memory cells are dynamic random access memory cells.

8. A memory device as in claim 6 wherein said first and second column selecting transistors couple said pair of bit lines to said second sense amplifier.

9. A memory device as in claim 6 wherein said first and second column selecting transistors couple said second sense amplifier to said amplifier.

10. A dynamic random access memory device comprising:
    a. a plurality of memory cells;
    b. a plurality of bit line pairs, each comprising first and second bit lines, for receiving data signals from said plurality of memory cells;
    c. a plurality of sense amplifiers, each said sense amplifier coupled to a selected bit line pair, for amplifying selected data signals;
    d. a block amplifier, comprising first and second driver MOS transistors, each having a gate electrode coupled to one bit line of said selected bit line pair, for amplifying said selected data signals when at least one sense amplifier is activated in a data reading operation;
    e. a pair of data input/output lines, comprising first and second data input/output lines, for extracting said selected data signals from said selected bit line pair;
    f. a local amplifier, having input terminals coupled to receive said selected data signals, for amplifying said selected data signals in a data reading operation;
    g. first and second column selecting transistors, having gate electrodes connected to a column selecting line, for coupling said bit line pair to said local amplifier;
    h. a first write transistor, having a current path coupled between said sense amplifier and one output terminal of said block amplifier, said first write transistor being turned on in a data writing operation; and
    i. a second write transistor, having a current path coupled between said sense amplifier and the other output terminal of said block amplifier, said second write transistor being turned on in a data writing operation.

* * * * *